United States Patent

[11] 3,610,870

[72] Inventor Makoto Sakamoto
Kodaira-shi, Japan
[21] Appl. No. 804,552
[22] Filed Mar. 5, 1969
[45] Patented Oct. 5, 1971
[73] Assignee Hitachi, Ltd.
Tokyo, Japan
[32] Priority Mar. 13, 1968
[33] Japan
[31] 43/15842

[54] METHOD FOR SEALING A SEMICONDUCTOR ELEMENT
8 Claims, 5 Drawing Figs.

[52] U.S. Cl. 219/117 R, 29/588, 29/627, 29/628, 219/93
[51] Int. Cl. B23k 11/14
[50] Field of Search 219/117, 93; 317/3, 3.1, 4; 29/588, 589, 627, 628

[56] References Cited

UNITED STATES PATENTS

| | | | |
|---|---|---|---|
| 3,007,089 | 10/1961 | King | 317/234 |
| 3,119,052 | 1/1964 | Tsuji | 317/234 |
| 3,181,043 | 4/1965 | Cotter | 317/235 |
| 3,198,999 | 8/1965 | Baker et al. | 29/588 |
| 3,414,433 | 12/1968 | Van Bramer | 317/234 |

*Primary Examiner*—J. V. Truhe
*Assistant Examiner*—J. G. Smith
*Attorney*—Craig, Antonelli, Stewart & Hill

ABSTRACT: A method for sealing a semiconductor device comprising the steps of fixing a semiconductor element onto a metal supporting plate, placing a metal cap over the metal supporting plate so as to enclose said semiconductor element and carrying out electric resistance welding at the overlapping portion for sealing said element, which method is characterized in that leads projecting from the metal supporting plate are covered by an insulator, electrodes of the element and top portions of said leads are connected by connectors, and then the surface of said element, connectors and leads are covered by an insulating material before the metal cap is placed over the metal supporting plate.

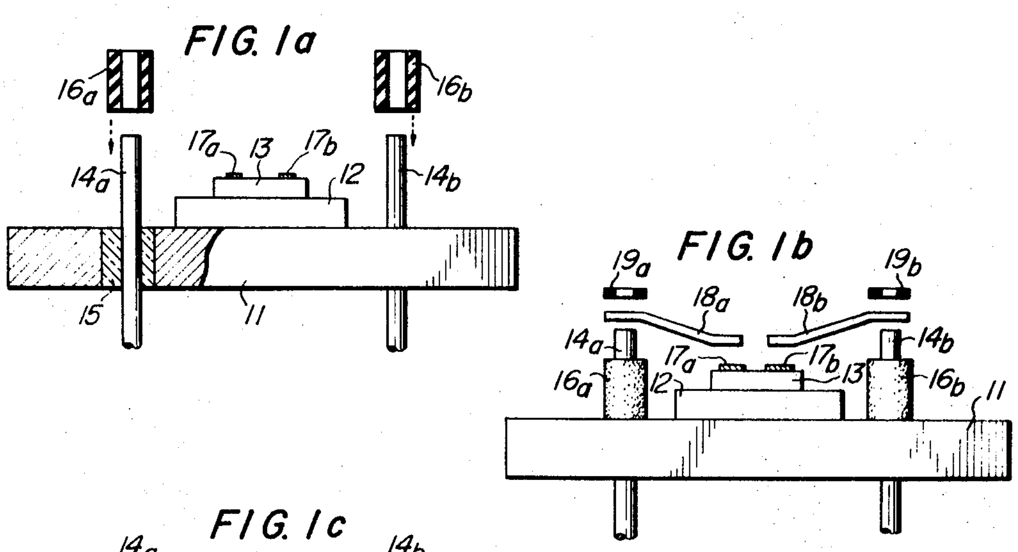
FIG. 1a FIG. 1b
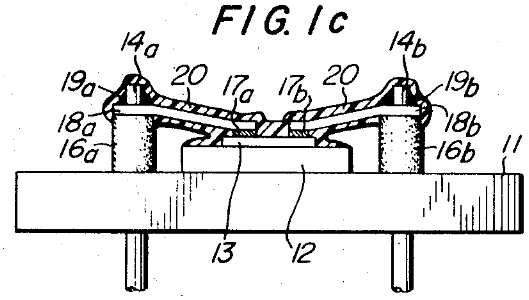
FIG. 1c
FIG. 1d
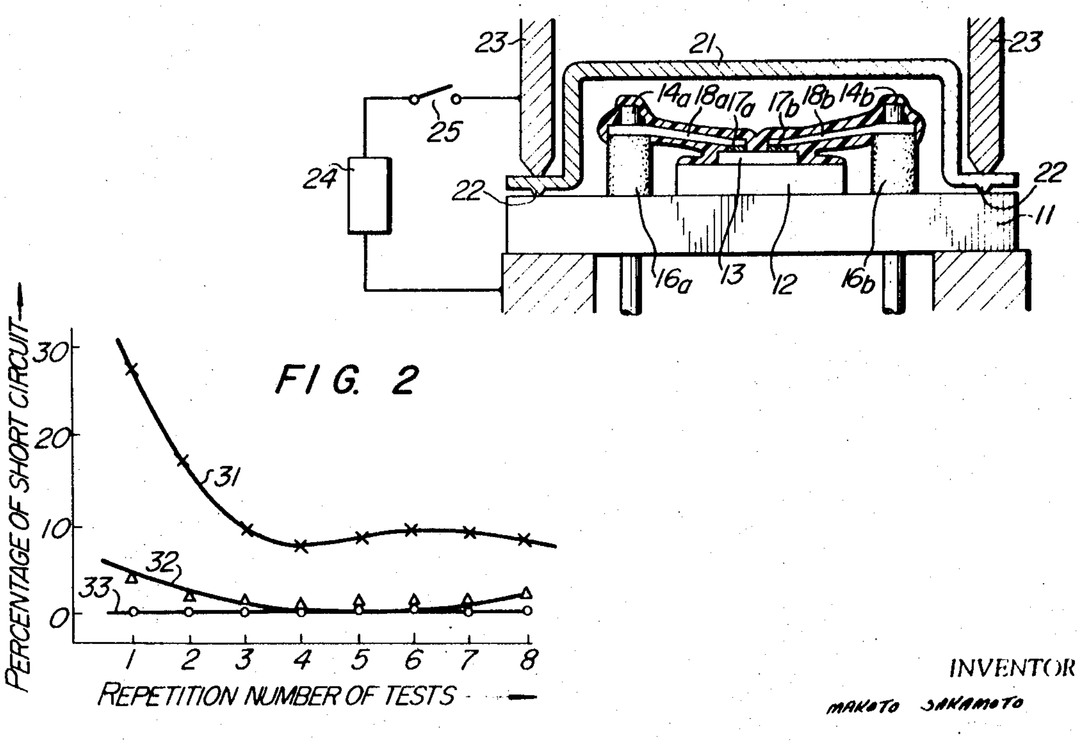
FIG. 1d FIG. 2
INVENTOR
MAKOTO SAKAMOTO
BY Craig, Antonelli, Stewart & Hill
ATTORNEYS

METHOD FOR SEALING A SEMICONDUCTOR ELEMENT

BACKGROUND OF THE INVENTION

1. Field of the Invention

This invention relates to a method for manufacturing a semiconductor device and the device and more particularly to an improvement of a method for sealing a semiconductor element into a capsule by utilizing the electric resistance welding method and the device thus obtained.

2. Description of the Prior Art

In a semiconductor device including an element comprising a PN junction, the device is usually hermetically sealed by means, for example, a metal package in order to prevent the deterioration of said junction caused by the influence of such factors as moisture from outside and to protect mechanically the electrode portion. When sealing of the metal package is carried out, the so-called ring-welding method is mainly employed because of its simplicity and reliability, wherein a metal cap is placed over a metal supporting plate on which a semiconductor element is mounted and electric resistance welding is carried out at a ring-shaped projected portion provided at a part of the overlapping peripheral portion.

In the conventional ring-welding method, the metal cap is placed over the metal supporting plate and the welding is carried out instantaneously by the temperature rise produced by the intensive current flowing through said ring-shaped projected portion. But this method has such a defect that powder of metal, called spatter (larger grain of which has a diameter of about 1 mm.), is scattered from the welding portion at the time of welding, attaches between the metal supporting plate (stem) and the leads extending through the supporting plate and/or between the connectors for connecting the semiconductor element to said leads of the stem and the substrate of the element, and short circuits the two thereat to lose the function of the semiconductor device. Further, even when the trouble of the short circuit is not caused instantly, there is always the possibility of a short circuit since the spattered particles remain in the capsule, then the reliability of the device and the breakdown voltage decrease.

SUMMARY OF THE INVENTION

An object of the present invention is to provide a method for obtaining a semiconductor device having high reliability.

Another object of the present invention is to provide a semiconductor device having a high-breakdown voltage and a method for manufacturing it.

The present invention aims to overcome the aforementioned defects, which is characterized in that when the semiconductor element is sealed by the ring- welding method, the surface of the element fixed on the metal supporting plate and the surface of the metal portion led out to the outside from the electrodes of the element, in particular, the leads and connectors are previously covered by an insulating material.

The above and other objects and features of the present invention will be more apparent from the following description of an embodiment of the present invention with reference to the accompanying drawings.

BRIEF DESCRIPTION OF THE DRAWINGS:

FIGS. 1*a*to 1*d* are cross sections showing a device at each step of the sealing process according to the sealing method of the present invention.

FIG. 2 is a graph showing a comparison of the occurrence rate of breakdown between transistor obtained by the conventional sealing method and the sealing method of the present invention.

DESCRIPTION OF THE PREFERRED EMBODIMENT:

Referring to FIG. 1*a*, the reference numeral 11 is a supporting plate of iron plated with copper and/or nickel, 12 a heating conducting plate of copper fixed at the center of the supporting plate 11, 13 a semiconductor substrate constituting a transistor element fixed on the heat conducting plate 12 and **14*a* and 14*b* are an emitter lead and a base lead, respectively, each of which is inserted in a hole of the supporting plate 11 through a glass portion 15**.

First, insulator tubes **16*a* and 16*b* are fitted on the leads 14*a* and 14*b* projecting on the supporting plate 11**, respectively, as shown in FIG. 1*a*. These insulator tubes are made of, for example, a glass block in the shape of a tube, the inner diameter of which is made so that it can be easily put on the lead and the length of which is made so short that a portion of the leads **14*a* and 14*b* projecting on the supporting plate 11 is exposed. The length of each of the tubes 16*a* and 16*b* is at least more than 1 mm. and desirably more than 2 mm. in order to prevent the possibility of short-circuiting which occurs between the supporting plate 11** which becomes the collector electrode and connectors to be fitted at the tip of the leads due to spattered particles during succeeding steps of the process.

Then, as shown in FIG. 1*b*, the emitter and base electrodes **17*a*, 17*b* of the transistor element 13 are connected by connectors 18*a*, 18*b*, with corresponding leads 14*a*, 14*b*, respectively, and each connecting portion is soldered by solder 19*a* or 19*b*. Here, said insulator tubes 16*a* and 16*b* determine the height of the position where the connectors 18*a* and 18*b*** are fixed to each lead at the time of connecting said connectors.

As shown in FIG. 1*c*, the exposed surfaces of said transistor element 13 and the connectors connected to the electrodes of the transistor and the exposed portion of the lead not covered by said block are covered by an insulating resin 20. Here, such a material as silicone resin mixed into an equal volume of solvent as xylene is used as insulating resin 20. This resin can be applied to a predetermined portion by brush or spray means. Here, it is not always necessary to apply the resin 20 on the whole exposed surface of the connectors, element and leads are shown in FIG. 1*c*, but is desirable to cover only a portion of the connectors **18*a* and 18*b* within a distance of at least 2 mm. from the element and/or the supporting plate (and heat conducting plate) connected to the element because of the relation to the spattered metal particles. Further, it is necessary that the resin 20 is not applied to the supporting plate 11**, especially, to the portion of the plate to be soldered or welded to a metal cap. After the resin is applied, the resin is baked and hardened by a heating process at 200° C. for 20 hours.

Finally, as shown in FIG. 1*d*, the metal cap 21 is placed over the supporting plate 11 and electric resistance welding is carried out at the ring-shaped projected portion 22 provided at the lower periphery of said metal cap by allowing a current to flow through the overlapping portion from a power source 24 by pushing a switch 25. In the step of welding, many spatters are produced from the welding place and are scattered around the element and connectors, but they do not attach directly to the surface of the leads, element and connectors because of the presence of said insulating material.

FIG. 2 is a graph showing the occurrence rate of the breakdown vs. number of repeated tests, which is obtained when the test of the breakdown caused by spatters produced at the time of sealing by means of the ring-welding method was carried out for comparing the cases when the method of the present invention was applied and was not applied. The method used in the test is as follows: a mechanical impact is applied to the transistor while observing the backward current-voltage characteristics of the collector PN junction, with the collector and emitter electrodes connected to a curve tracer (i.e. cathode-ray tube oscilloscope). Namely, an impact force of about 30 G is repeatedly applied 50 times in one test. The number of times the test is repeated is indicated along the abscissa. Among the curves shown in the figure, the curves 31 and 32 show the case where only the surface of the element is covered by the resin, wherein 31 shows the case where there are many spatters and 32 shows the case where there are few spatters. The curve 33 shows the case of the sealing of an embodiment according to the present invention, wherein not only the surface of the element but also the connectors and leads are covered by insulating material. It can be seen from the figure that the occurrence of the breakdown is made zero in spite of the considerable amount of impact by means of the sealing method of the present invention, and the functional disorder of the semiconductor device due to the spatters, for example, the lowering of the reliability and fall of the breakdown voltage can be completely prevented by means of the present invention.

Though, the present invention has been described taking the sealing of a transistor as an example, the construction of the present invention can be applied to the sealing of other semiconductor devices, especially, to the sealing of an integrated circuit having a complicated electrode structure, and greater effectiveness is expected to result. Further, the case where the glass block tube is fitted as insulator on the lead was described as an example, and of course another insulating material such as insulating resins can be used to cover the lead.

What is claimed is:

1. A method of manufacturing a semiconductor device comprising the successive steps of:

a. providing a combination comprising a metal-supporting plate having at least two opposing principal surfaces, at least one lead extending through said supporting plate from one principal surface to another principal surface, said lead being insulated from and supported by said supporting plate by means of a first insulating material and a semiconductor substrate disposed on one principal surface of said supporting plate, one portion of said substrate being electrically connected to said supporting plate;

b. covering the portion of said lead extending out of said one principal surface by a second insulator material in such a way that the tip portion of the lead is exposed;

c. electrically connecting another portion of said semiconductor substrate and said exposed tip portion of said lead by means of a connector;

d. covering said semiconductor substrate on said one principal surface by a third rigid insulator material, e. placing a metal cap over said one principal surface of said metal supporting plate to cover said semiconductor substrate, said lead and said connector; and then f. welding the overlapping portion by electric resistance welding for sealing the semiconductor substrate into an airtight space defined by said metal supporting plate and said metal cap.

2. A method of manufacturing a semiconductor device according to claim 1, in which the whole exposed surface of said semiconductor substrate and the whole exposed surface of said connector are covered by said third rigid insulator material.

3. A method of manufacturing a semiconductor device comprising the successive steps of;

a. providing a combination comprising a metal supporting plate having first and second principal surfaces and first and second holes extending from the first principal surface to the second principal surface, first and second leads extending from the first principal surface to the second principal surface through said first and second holes, respectively, said first and second leads being fixed to said metal supporting plate and insulated from said metal supporting plate by means of a first and second insulating material, respectively, a semiconductor substrate electrically and mechanically connected onto said first principal surface;

b. locating first and second insulator tubes on a portion of said first and second leads projecting from said first principal surface in such a way that the tip portions of the first and second leads are exposed;

c. electrically connecting a first portion of said semiconductor substrate and the exposed tip portion of said first lead by means of a first connector;

d. electrically connecting a second portion of said semiconductor substrate and the exposed tip portion of said second lead by means of a second connector;

e. covering said semiconductor substrate by a third rigid insulator material;

f. placing a metal cap over said first principal surface of said metal supporting plate to cover said semiconductor substrate, said first and second leads and said first and second connectors; and then g. carrying out electric resistance welding at the overlapping portion for sealing the semiconductor substrate into an airtight space defined by said metal supporting plate and said metal cap.

4. A method of manufacturing a semiconductor device according to claim 3, in which said first and second insulator material is comprised of glass, said first and second tubes are also comprised of glass and said third insulator material is comprised of resin.

5. A method of manufacturing a semiconductor device comprising the steps of:

a. providing a metal supporting plate having at least two opposing principal surfaces and at least one hole passing therethrough and through each of said principal surfaces;

b. disposing at least one conductive lead, the length of which is greater than the distance between the principal surfaces through which said hole passes, in said at least one hole and providing a first insulating material between said lead and said supporting plate, so that said lead extends out from one principal surface of said plate and is supported therein;

c. disposing an electrically connecting semiconductor substrate on one principal surface of said substrate; and successively performing the following steps:

d. covering the portion of said lead extending out from said surface with a second insulator material, so as to expose a tip portion of said lead;

e. electrically connecting, by means of a connector, another portion of said semiconductor substrate to the exposed tip portion of said lead;

f. covering said semiconductor substrate disposed on said one principal surface with a third rigid insulator material;

g. placing a metal cap over said one principal surface over said supporting plate, so as to cover said semiconductor substrate, said at least one lead and said connector; and h. sealing the semiconductor substrate into an airtight space defined by said metal supporting plate and said metal cap by welding the portion of said cap contacting said plate through a resistance welding process.

6. A method in accordance with claim 5, wherein said step of (f) of covering said substrate comprises the step of covering the entire exposed surface of said semiconductor substrate and the entire exposed surface of said connector with said third rigid insulator material.

7. A method in accordance with claim 6, wherein said supporting plate is made of iron, said first insulating material is made of glass, said second insulator is made of glass and wherein said third rigid insulator is made of resin.

8. A method in accordance with claim 7, wherein said step (c) of electrically connecting said semiconductor substrate to one principal surface comprises the step of disposing a heat conducting plate of copper between said semiconductor substrate and said supporting